US009064886B2

(12) United States Patent
Preisler et al.

(10) Patent No.: US 9,064,886 B2
(45) Date of Patent: *Jun. 23, 2015

(54) HETEROJUNCTION BIPOLAR TRANSISTOR HAVING A GERMANIUM EXTRINSIC BASE UTILIZING A SACRIFICIAL EMITTER POST

(71) Applicant: Newport Fab, LLC, Newport Beach, CA (US)

(72) Inventors: Edward Preisler, San Clemente, CA (US); David J. Howard, Irvine, CA (US); George Talor, Mission Viejo, CA (US); Gerson R. Ortuno, La Verne, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/175,914

(22) Filed: Feb. 7, 2014

(65) Prior Publication Data

US 2014/0264458 A1    Sep. 18, 2014

Related U.S. Application Data

(60) Provisional application No. 61/778,192, filed on Mar. 12, 2013.

(51) Int. Cl.

| H01L 21/331 | (2006.01) |
|---|---|
| H01L 29/737 | (2006.01) |
| H01L 29/66 | (2006.01) |
| H01L 21/8222 | (2006.01) |
| H01L 21/8224 | (2006.01) |
| H01L 21/8249 | (2006.01) |
| H01L 29/08 | (2006.01) |

(Continued)

(52) U.S. Cl.
CPC ...... *H01L 29/66242* (2013.01); *H01L 21/8222* (2013.01); *H01L 21/8224* (2013.01); *H01L 27/0623* (2013.01); *H01L 21/8249* (2013.01); *H01L 29/66272* (2013.01); *H01L 29/7371* (2013.01); *H01L 29/0817* (2013.01); *H01L 29/0821* (2013.01); *H01L 29/1004* (2013.01); *H01L 29/16* (2013.01)

(58) Field of Classification Search
CPC .......... H01L 21/8249; H01L 21/8222; H01L 29/1004; H01L 29/66242; H01L 27/0623
USPC ................. 257/197, 592, E21.371, E21.379, 257/E29.044, E29.193, 565, E29.045; 438/312
See application file for complete search history.

(56) References Cited

U.S. PATENT DOCUMENTS

| 6,940,149 B1 * | 9/2005 | Divakaruni et al. ......... 257/565 |
| 6,982,442 B2 * | 1/2006 | Chan et al. ................. 257/198 |

(Continued)

*Primary Examiner* — Marvin Payen
*Assistant Examiner* — Jeremy Joy
(74) *Attorney, Agent, or Firm* — Farjami & Farjami LLP (57) ABSTRACT

Disclosed is a method for fabricating a heterojunction bipolar transistor ("HBT"), and the resulting structure. The method includes forming a germanium layer over a SiGe layer, the SiGe layer including an intrinsic base. Thereafter, an emitter sacrificial post and a raised germanium extrinsic base are formed by etching away portions of the germanium layer. Then, a conformal dielectric layer is deposited over the raised germanium extrinsic base. The process continues by removing the emitter sacrificial post and forming an emitter over the intrinsic base within an emitter opening defined by the previous removal of the emitter sacrificial post. The resulting structure has a raised germanium extrinsic base with a reduced parasitic base-collector capacitance.

20 Claims, 5 Drawing Sheets

(51) Int. Cl.
*H01L 29/10* (2006.01)
*H01L 27/06* (2006.01)
*H01L 29/16* (2006.01)

(56) References Cited

U.S. PATENT DOCUMENTS

| | | | |
|---|---|---|---|
| 2002/0024061 A1* | 2/2002 | Kondo et al. | 257/198 |
| 2004/0188711 A1* | 9/2004 | Coolbaugh et al. | 257/197 |
| 2004/0224461 A1* | 11/2004 | Dunn et al. | 438/205 |
| 2006/0231924 A1* | 10/2006 | Adam et al. | 257/565 |
| 2007/0085167 A1* | 4/2007 | Saitoh et al. | 257/565 |
| 2008/0078997 A1* | 4/2008 | Khater | 257/51 |
| 2009/0065804 A1* | 3/2009 | Pagette et al. | 257/190 |
| 2009/0206370 A1* | 8/2009 | Chu et al. | 257/197 |
| 2011/0309471 A1* | 12/2011 | Camillo-Castillo et al. | 257/526 |
| 2013/0119434 A1* | 5/2013 | Adkisson et al. | 257/197 |

* cited by examiner

HETEROJUNCTION BIPOLAR TRANSISTOR HAVING A GERMANIUM EXTRINSIC BASE UTILIZING A SACRIFICIAL EMITTER POST

The present application claims the benefit of and priority to a provisional patent application titled "Bipolar Transistor Having a Germanium Extrinsic Base Utilizing a Sacrificial Emitter Post," Ser. No. 61/778,192, filed on Mar. 12, 2013. The disclosure in this provisional application is hereby incorporated fully by reference into the present application.

BACKGROUND

As semiconductor devices continue to decrease in size, optimal device operation becomes more difficult to achieve. For example, when scaling advanced bipolar transistors two factors are of primary importance: 1) scaling the vertical emitter-base-collector dimension to improve cutoff frequency ($F_t$) and DC current gain ($\beta$), and 2) scaling the lateral dimension of the bipolar transistor to improve the maximum frequency of unity power gain ($F_{max}$) and the RF noise figure ($Nf_{min}$). In bipolar transistors, lateral scaling has typically focused on reducing the parasitic extrinsic base resistance ($R_{bx}$) and extrinsic base-collector capacitance ($C_{BC}$).

In order to reduce the extrinsic base-collector capacitance, "raised base" techniques have been used. Over the last decade, conventional raised base techniques have utilized processes having a separate deposition step for creating an epitaxially grown extrinsic base region that connects the single-crystal intrinsic base region to the base contact. In a typical raised base scheme the raised extrinsic base material is silicon (Si), and preferably polysilicon. Consequently, the size of conventionally formed bipolar transistors is limited by the physical properties of the epitaxial silicon raised extrinsic base. Moreover, fabrication of a silicon raised base often significantly increases manufacturing costs, and requires high temperature processing and is accompanied by difficulty in etching and forming the silicon raised base due to low etchant selectivity during fabrication.

SUMMARY

The present disclosure is directed to a heterojunction bipolar transistor having a germanium extrinsic base utilizing a sacrificial emitter post, substantially as shown in and/or described in connection with at least one of the figures, and as set forth more completely in the claims.

DETAILED DESCRIPTION

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

As stated above, as semiconductor devices continue to decrease in size, optimal device operation becomes more difficult to achieve. For example, when scaling advanced bipolar transistors two factors are of primary importance: (1) scaling the vertical emitter-base-collector dimension to improve cutoff frequency ($F_t$) and DC current gain ($\beta$), and (2) scaling the lateral dimension of the bipolar transistor to improve the maximum frequency of unity power gain ($F_{max}$) and the RF noise figure ($Nf_{min}$). In bipolar transistors, lateral scaling has typically focused on reducing the parasitic extrinsic base resistance ($R_{bx}$) and extrinsic base-collector capacitance ($C_{BC}$).

Over the last decade, conventional "raised base" techniques have utilized processes having a separate deposition step for creating an epitaxially grown extrinsic base region that connects the single-crystal intrinsic base region to the base contact. However, as the lateral distance between the extrinsic base and intrinsic base decreases, extreme proximity of dopants within the extrinsic base to the intrinsic base can undesirably influence the effective size, shape and performance of the intrinsic base. In all such raised base schemes the raised extrinsic base material is silicon (Si), and preferably polysilicon. Consequently, the size of conventionally formed bipolar transistors is limited by the physical properties of the epitaxial silicon raised extrinsic base.

The present inventive concepts utilize a raised extrinsic base made of substantially pure germanium (Ge) to achieve smaller heterojunction bipolar transistors (HBTs) than are possible using conventional fabrication methods and without adding any new tooling relative to that already present in standard very large scale integration (VLSI) fabrication processes. The advantages of the present inventive concepts may include a reduced cost of fabrication due to lower process temperatures and the elimination of one or more process steps related to conventional epitaxial silicon raised extrinsic base fabrication, a reduced extrinsic base resistance, and an increased etchant selectivity during fabrication.

Figure 1A:
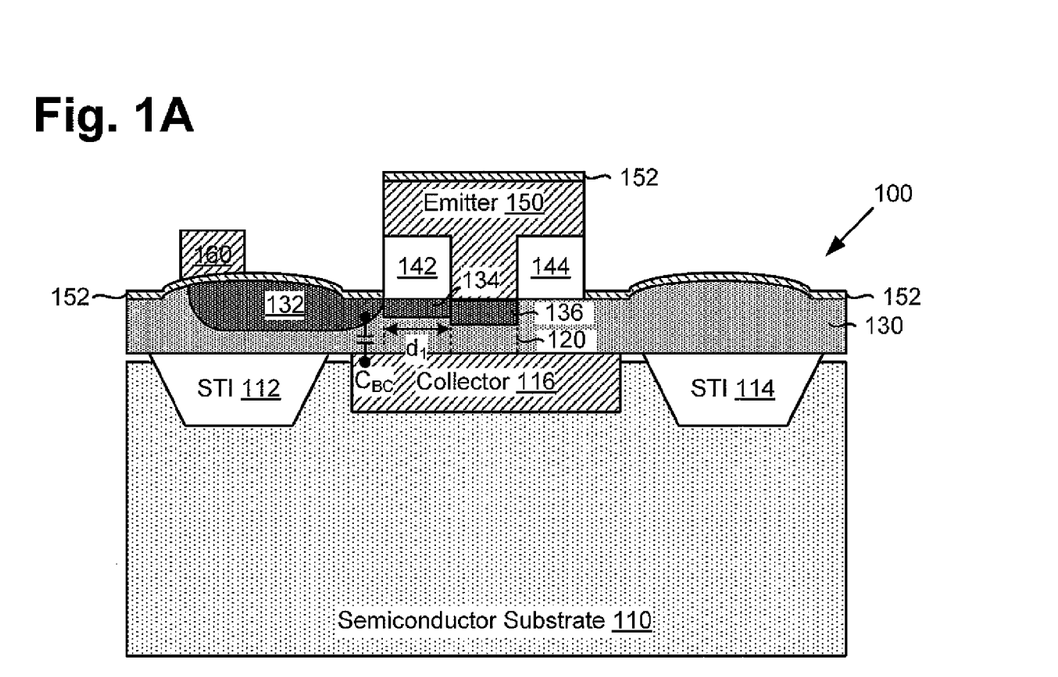
FIG. 1A presents an exemplary diagram showing a cross section of a conventional heterojunction bipolar transistor ("HBT").

FIG. 1A presents an exemplary diagram showing a cross section of a conventional HBT. FIG. 1A shows conventional HBT 100, including semiconductor substrate 110, which may be silicon, for example. However, semiconductor substrate 110 is not limited to silicon and may be any appropriate substrate material, such as silicon-germanium (SiGe). Semiconductor substrate 110 may include collector 116 disposed between shallow trench isolation (STI) region 112 and STI region 114. SiGe layer 130 may be grown on semiconductor substrate 110 and typically has a germanium concentration of between 20% and 30%. Oxide post 142 and oxide post 144 may be deposited over SiGe layer 130 and an emitter 150 may be formed between and over oxide posts 142 and 144. Emitter 150 may be formed of N type single-crystal silicon or polysilicon, for example. Intrinsic base 136, which in the present implementation is a single-crystal SiGe, is formed within intrinsic base region 120, and is discussed in more detail below regarding FIG. 1B. Extrinsic base region 132 may be formed adjacent to oxide post 142 either within SiGe layer 130, or alternatively, in an epitaxially grown silicon layer formed on SiGe layer 130 (not shown). In either case, extrinsic base region 132 may be doped with a P type dopant, such as boron. Link base region 134 may also include P type dopants and may electrically connect extrinsic base 132 with intrinsic base region 120. Intrinsic base region 120 is typically a single-crystal SiGe. Silicide layer 152 may be formed over top surfaces of SiGe layer 130 and emitter 150 to provide very low resistance contact points for extrinsic base 132 and base contact 160, as well as for emitter 150.

In order to increase device density, the vertical and lateral dimensions of HBTs must be decreased. However, simply decreasing the vertical and lateral dimensions of HBT 100 may have several undesired effects. For example, as the vertical dimension of HBT 100 is decreased, the shortened distance between extrinsic base region 132 and collector 116 causes an increase in parasitic base-collector capacitance $C_{BC}$, effectively reducing the maximum frequency at which HBT 100 can properly operate. In addition, as the lateral dimension of HBT 100 is decreased the distance $d_1$ between extrinsic base 132 and intrinsic base 136 also decreases. The close proximity of extrinsic base 132 means that out-diffusion of dopants from extrinsic base 132 materially affect the doping profile of intrinsic base 136. Such doping profile effects are shown in more detail in FIG. 1B.

Figure 1B:
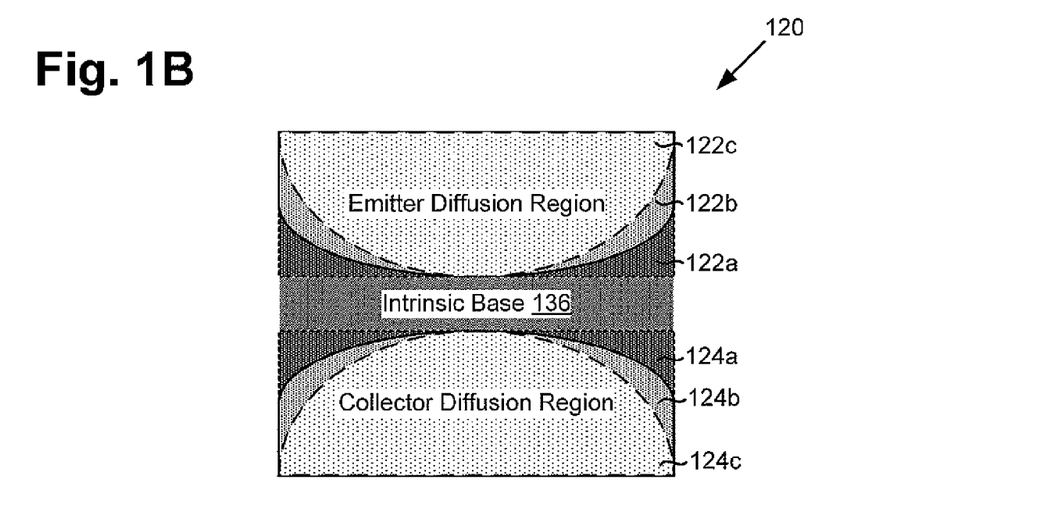
FIG. 1B presents an exemplary diagram showing a magnified view of a cross section of an intrinsic base region shown in FIG. 1A.

FIG. 1B presents an exemplary diagram showing a magnified view of a cross section of intrinsic base region 120 shown in FIG. 1A. Intrinsic base region 120 includes P type intrinsic base 136 and also shows three alternative emitter diffusion profiles and three alternative collector diffusion profiles that may be alternatively formed. Emitter diffusion region 122a may represent an ideal emitter diffusion profile, in which dopants from N type emitter 150 may diffuse evenly down into SiGe layer 130. Similarly, collector diffusion region 124a may represent an ideal collector diffusion profile, in which dopants from N type collector 116 may diffuse evenly up into SiGe layer 130. In this ideal case, the effective width of intrinsic base 136 may be at a maximum possible width.

Emitter diffusion region 122b and collector diffusion region 124b may represent actual emitter and collector diffusion regions, respectively, where extrinsic base region 132 is not too close to intrinsic base 136. Due to a small diffusion effect from P++ type dopants in link base region 134 and extrinsic base region 132, N type dopants from emitter 150 above and collector 116 below do not fully diffuse to contact the entire width of intrinsic base 136, very slightly decreasing the effective width of intrinsic base 136 from the ideal width.

Emitter diffusion region 122c and collector diffusion region 124c may represent actual emitter and collector diffusion regions, respectively, where extrinsic base region 132 is too close to intrinsic base 136. Due to a substantial diffusion effect from P++ type dopants in link base region 134 and extrinsic base region 132, N type dopants from emitter 150 above and collector 116 below diffuse to a point considerably short of contacting the entire width of intrinsic base 136, substantially decreasing the effective width of intrinsic base 136 from that of the ideal width.

In an effort to overcome the above-described effects, a raised extrinsic base of epitaxial silicon is formed on SiGe layer 130. Raising the extrinsic base above the SiGe layer decreases the parasitic base-collector capacitance $C_{BC}$ by further physically separating the extrinsic base from the collector. This also improves lateral scaling by increasing the 3-dimensional straight-line distance between the extrinsic base and the intrinsic base. However, the presently known raised base fabrication schemes utilize silicon for the raised extrinsic base, limiting performance of the HBT by the physical properties of silicon as discussed below.

According to the present inventive concepts, a specialized raised extrinsic base made from substantially pure germanium (also referred to as a "raised germanium extrinsic base" herein) is utilized to further improve HBT performance. For example, it has been found that holes in doped single-crystal germanium are approximately four times more conductive than silicon with comparable doping, yielding approximately four times lower resistance for the same dimensioned raised extrinsic base. Moreover, there is evidence that polycrystalline germanium can be more conductive than polysilicon, the polycrystalline germanium having almost metal-like conductive qualities. In addition, germanium is etched by different chemicals than silicon, which allows increased selectivity when etching one in the presence of the other. Also, germanium has a far lower melting point than silicon (938° C. for germanium versus 1414° C. for silicon), allowing lower process temperatures than those required by silicon or SiGe based processes. This is advantageous because as dimensions continue to decrease, process temperatures will also necessarily fall.

Figure 2:
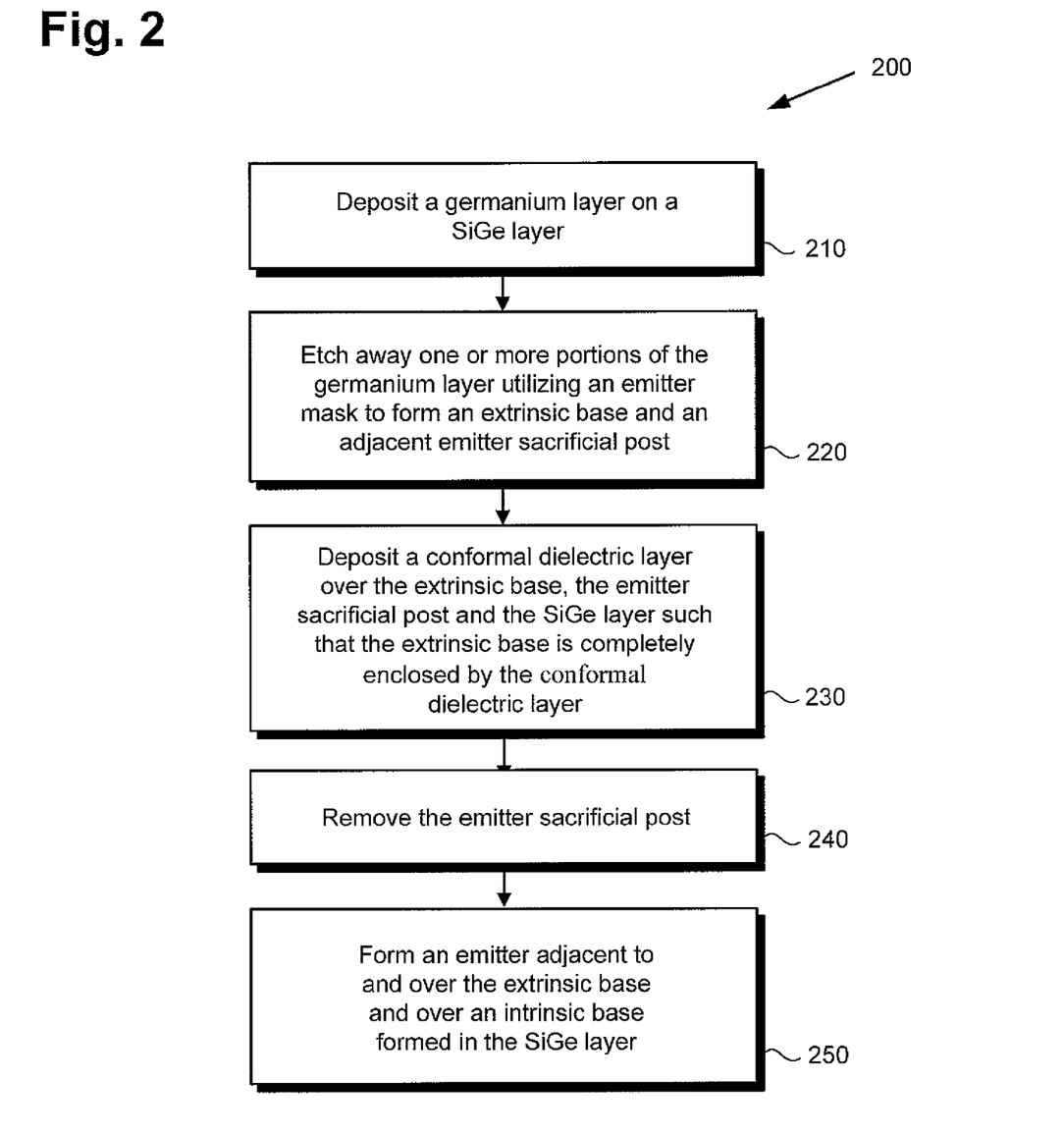
FIG. 2 shows a flowchart of a method for fabricating an HBT having a germanium extrinsic base utilizing a sacrificial emitter post.
Figure 3A:
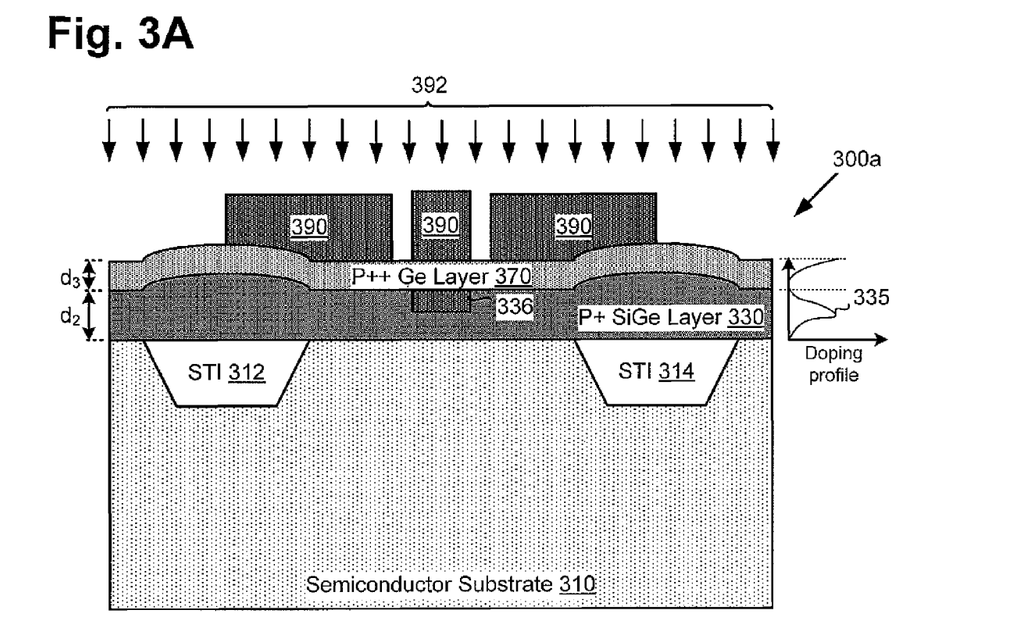
FIG. 3A shows an initial HBT structure during an initial stage of fabrication of an HBT according to one implementation of the present application.

A method for fabricating a bipolar transistor having a germanium extrinsic base utilizing a sacrificial emitter post, according to the present inventive concepts, will now be discussed with reference to FIG. 2 and FIGS. 3A, 3B, 3C, 3D and 3E. FIG. 2 shows a flowchart of a method for fabricating a bipolar transistor having a germanium extrinsic base utilizing a sacrificial emitter post, in accordance with one implementation of the present application. FIG. 2 shows flowchart 200 having actions 210, 220, 230, 240 and 250. Action 210 may include depositing a germanium layer on a SiGe layer. For example, FIG. 3A shows semiconductor substrate 310 including STIs 312 and 314. SiGe layer 330 may be disposed on a top surface of semiconductor substrate 310. SiGe layer 330 may be formed by flowing silicon and germanium into a reaction chamber at an appropriate rate, pressure and temperature until a desired thickness $d_2$ is reached. SiGe layer 330 may also be in situ doped with a P type dopant, such as boron or any suitable P type dopant. Once the desired thickness has been reached, the flow of silicon may be discontinued while the flow of germanium is continued until germanium layer 370 is formed to a desired thickness $d_3$. Forming germanium layer 370 in this manner allows continuous formation of both SiGe layer 330 and germanium layer 370 and provides the additional benefit of producing a very low imperfection density at the SiGe/germanium interface. For the purposes of this application, substantially pure germanium may be understood to correspond to a germanium concentration of approximately 90% or greater. Germanium layer 370 may also be in situ P++ doped with a P type dopant such as boron.

As can be seen by doping profile 335, P type dopants are not initially introduced in situ so that a very thin bottom portion of SiGe layer 330 remains undoped. Doping concentrations may be quickly increased to form a concentration spike of P type dopants near the center of SiGe layer 330 and then brought to a substantially zero value at the interface between SiGe layer 330 and germanium layer 370. Doping concentrations may again be increased quickly as germanium layer 370 is grown. Intrinsic base 336 may also be formed in SiGe layer 330 by P type doping at the appropriate time by any conventional method known to those of ordinary skill in the art.

Continuing to action 220, action 220 of flowchart 200 may include etching away one or more portions of the germanium layer utilizing an emitter window mask to form an extrinsic base region and an adjacent emitter post. FIG. 3A shows HBT 300a during application of action 220 and after application of action 210. For example, emitter window mask 390 may be a photo-resist mask and may be formed on germanium layer 370. Portions of germanium layer 370 will be removed such that an emitter sacrificial post and adjacent extrinsic base regions are formed with gaps between each. This may be achieved by utilizing an anisotropic etch chemistry which is highly selective to germanium, etching germanium at a rate of at least 20× that of silicon. This allows for removal of select portions of germanium layer 370 to form extrinsic base 374 (shown in FIG. 3B) and extrinsic base 376 (shown in FIG. 313) as well as emitter sacrificial post 378 (shown in FIG. 3B) without risking etching intrinsic base 336 formed in a top surface of SiGe layer 330. Such etch actions are shown by etchant 392. The shape of the emitter window mask is important in that it opens up not only the area that will eventually serve as the emitter window, but also all regions of the semiconductor substrate external to the HBT. This will allow for complete encapsulation of extrinsic bases 374 and 376 by a single subsequent dielectric deposition action as discussed further below.

Figure 3B:
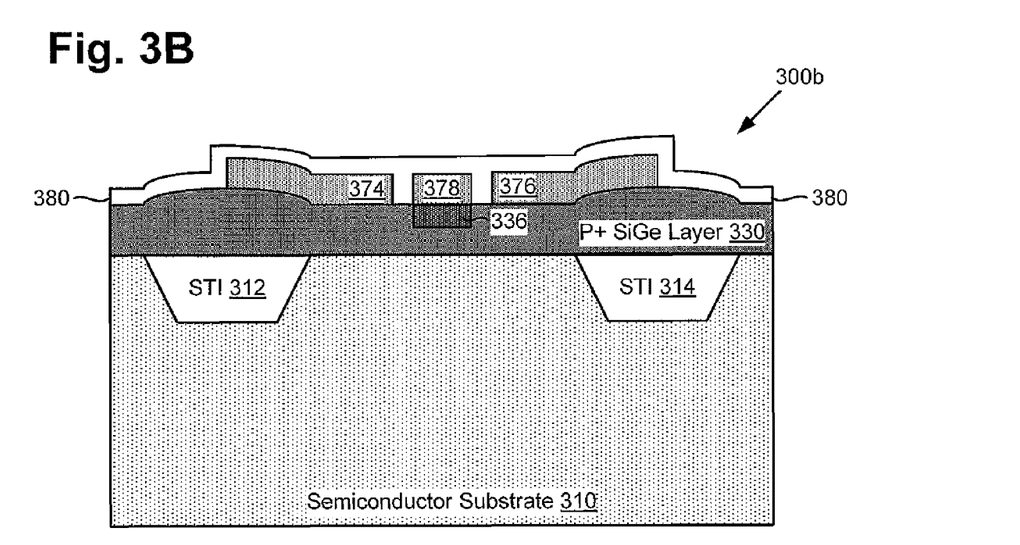
FIG. 3B shows an intermediate HBT structure during an intermediate stage of fabrication of an HBT according to one implementation of the present application.

Continuing to action 230, action 230 of flowchart 200 may include depositing a conformal dielectric layer over the extrinsic base, the emitter sacrificial post, and the SiGe layer such that the extrinsic base is completely enclosed by the dielectric layer. FIG. 3B shows HBT 300b corresponding to HBT 300a of FIG. 3A after application of action 230. For example, dielectric layer 380 may provide a conformal dielectric layer over the entire exposed surface of SiGe layer 330 and on the top surfaces and all sidewalls of extrinsic bases 374 and 376 and emitter sacrificial post 378. This ensures that all gaps between extrinsic bases 374 and 376 and emitter sacrificial post 378 are completely filled with a dielectric layer. Conformal dielectric layer 380 may be a nitride dielectric material such as silicon nitride or silicon oxynitride having an etch chemistry different from silicon and/or SiGe.

Figure 3C:
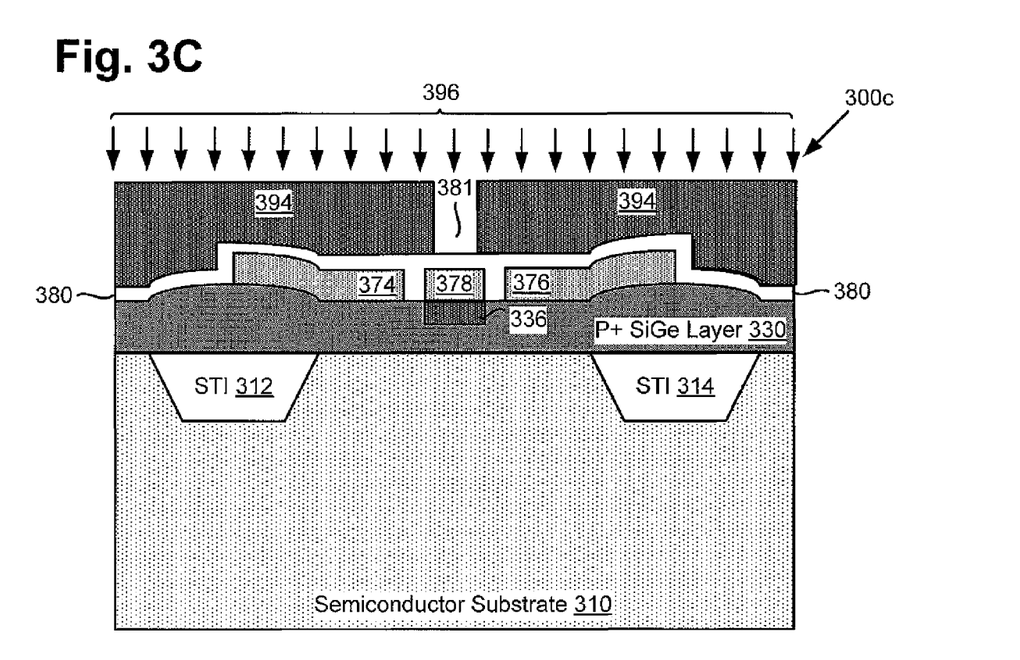
FIG. 3C shows an intermediate HBT structure during an intermediate stage of fabrication of an HBT according to one implementation of the present application.

Action 240 of flowchart 200 may include removing the emitter sacrificial post. FIG. 3C shows HBT 300c corresponding to HBT 300b of FIG. 3B during application of action 240. For example, photoresist mask 394 may be deposited on conformal dielectric layer 380 and patterned such that that an opening in the mask is aligned with emitter sacrificial post 378 in the vertical direction. Applying any appropriate nitride-selective etchant, a portion of conformal dielectric layer 380 may be removed over emitter sacrificial post 378, exposing emitter sacrificial post 378 through emitter opening 381. This etch may be a wet etch and is shown by etchant 396. This etch may be continued slightly into emitter sacrificial post 378. However, care must be taken not to etch completely through emitter sacrificial post 378 because there is no backside etch stop layer.

Figure 3D:
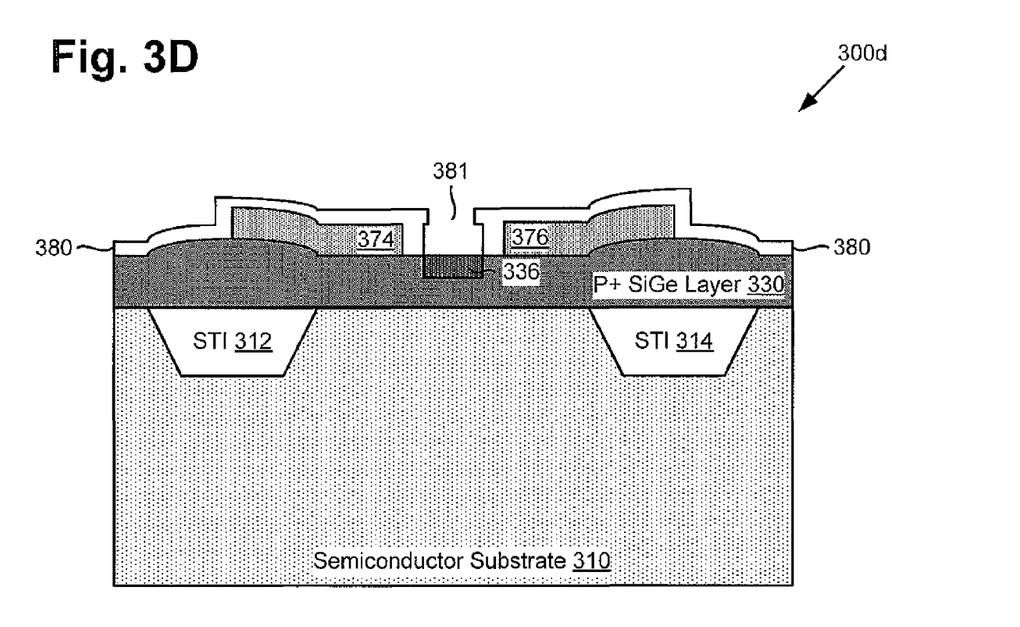
FIG. 3D shows an intermediate HBT structure during an intermediate stage of fabrication of an HBT according to one implementation of the present application.

Once emitter sacrificial post 378 is exposed, a hydrogen peroxide ($H_2O_2$) bath may be utilized to remove the remainder of emitter sacrificial post 378 with near perfect selectivity to germanium, as $H_2O_2$ will not etch silicon, silicon nitride, or silicon oxynitride. At this point in the process flow, dielectric layer 380 still completely encloses each of germanium extrinsic bases 374 and 376. This is important because germanium is attacked by typical photoresist removal wet chemistry including hydrogen peroxide ($H_2O_2$), and also because subsequent dopant activation by annealing is likely to melt extrinsic bases 374 and 376, requiring their complete encapsulation. FIG. 3D shows HBT 300d corresponding to HBT 300c of FIG. 3C after application of action 240.

Extrinsic bases 374 and 376 may now survive the high thermal cycles present in the rest of a standard HBT process flow. In fact, it is expected that extrinsic bases 374 and 376 will melt and re-crystallize several times during the remaining process flow. This is advantageous because underlying SiGe layer 330 will act as a seed crystal layer causing extrinsic bases 374 and 376 to re-crystallize in single-crystal form over areas where SiGe layer 330 has a single-crystal structure. This process will be described in more detail regarding FIG. 3E below.

Figure 3E:
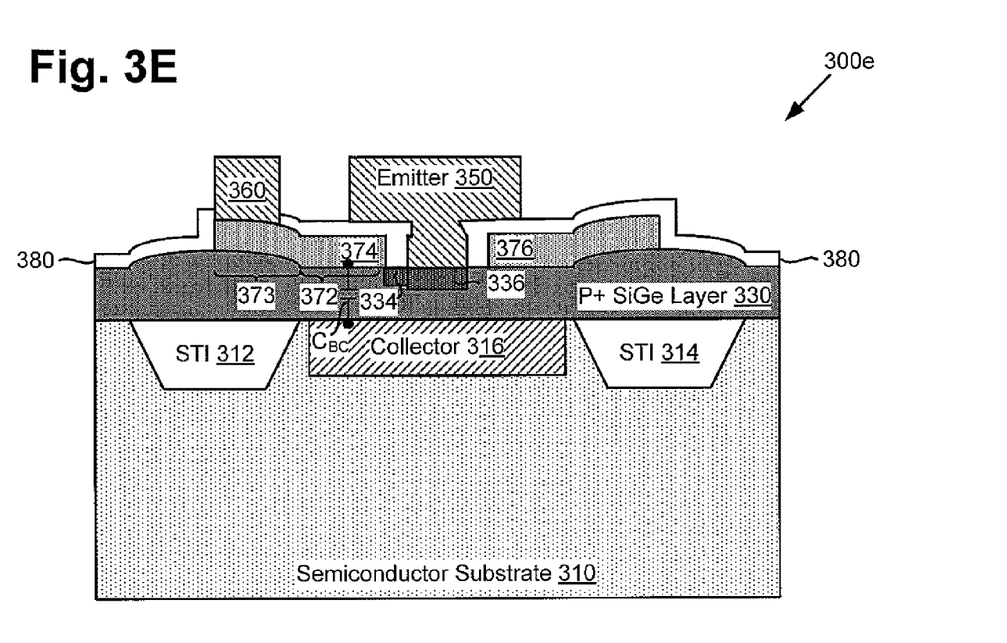
FIG. 3E shows a final HBT structure after fabrication of an HBT according to one implementation of the present application.

Continuing with action 250, action 250 of flowchart 200 may include forming an emitter adjacent to and over the extrinsic base and over an intrinsic base formed in the SiGe layer. FIG. 3E shows HBT 300e corresponding to HBT 300d of FIG. 3D after application of action 250. For example, emitter 350 may comprise N type polysilicon, and may be formed in an emitter window between extrinsic bases 374 and 376. Thus, emitter 350 may be formed adjacent to and over extrinsic bases 374 and 376 and on intrinsic base 336 formed in SiGe layer 330. As discussed above, extrinsic bases 374 and 376 may cyclically liquefy and re-crystallize during this and subsequent processes. Extrinsic bases 374 and 376 may re-crystallize into one of several crystal structures, depending largely on the crystal structure of SiGe layer 330 at each portion under extrinsic bases 374 and 376. For example, the substantially flat portions of SiGe layer 330 shown in FIGS. 3A through 3E may be single-crystal SiGe due to a seed crystal effect from underlying semiconductor substrate 310. However, the mounded portions of SiGe layer 330 may correspond to a polycrystalline formation due to the fact that STIs 312 and 314 do not provide a seed crystal from which to grow uniformly. Thus, portion 372 of extrinsic base 374 disposed over single-crystal SiGe may be single-crystal germanium, while portion 373 of extrinsic base 374 disposed over polycrystalline SiGe may be polycrystalline germanium.

In addition, as shown in FIG. 3E, a portion of dielectric layer 380 may need to be removed in order to connect base contact 360 with extrinsic base 374. Once this portion of dielectric layer 380 is removed a silicide layer (not shown) may be formed on the exposed portion of extrinsic base 374 in order to provide a very low resistance contact surface for base contact 360. For completeness, also shown in FIG. 3E are collector 316 corresponding to collector 116 in FIG. 1A, link base 334 corresponding to link base 134 in FIG. 1A, and extrinsic (or parasitic) base-collector capacitance ($C_{BC}$). Conventional HBT process flows may be followed from this point.

Thus, the present inventive concepts utilize a raised extrinsic base made of germanium to reduce extrinsic (or parasitic) base-collector capacitance (CO and to achieve smaller HBTs than are possible using conventional fabrication methods and without adding any new tooling relative to that already present in standard VLSI fabrication processes. Some of the advantages of the present inventive concepts include a reduced cost of fabrication due to lower process temperatures and the elimination of one or more process steps related to conventional epitaxial silicon raised extrinsic base fabrication, a reduced extrinsic base resistance, and an increased etchant selectivity during fabrication.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A method for fabricating a heterojunction bipolar transistor ("HBT") comprising:
   forming a germanium layer over a SiGe layer, said SiGe layer including an intrinsic base;
   forming an emitter sacrificial post and a raised germanium extrinsic base by etching away portions of said germanium layer, said emitter sacrificial post in direct contact with said SiGe layer;
   depositing a conformal dielectric layer over said raised germanium extrinsic base;
   removing said emitter sacrificial post;
   forming an emitter over said intrinsic base within an emitter opening defined by said removing said emitter sacrificial post.

2. The method of claim 1 wherein said raised germanium extrinsic base is situated within an opening in said conformal dielectric layer.

3. The method of claim 1 wherein said raised germanium extrinsic base is encapsulated within said conformal dielectric layer, said conformal dielectric layer being defined on one side thereof by removing said emitter sacrificial post.

4. The method of claim 1, wherein a link base provides electrical connection between said intrinsic base and said raised germanium extrinsic base.

5. The method of claim 1, wherein said conformal dielectric layer comprises a nitride based dielectric.

6. The method of claim 1 wherein said intrinsic base comprises a single-crystal SiGe.

7. The method of claim 1 wherein said emitter comprises N type polysilicon.

8. The method of claim 1 wherein said collector is situated between two shallow trench isolation regions.

9. The method of claim 1 further comprising forming a base contact over and electrically coupled to said raised germanium extrinsic base.

10. The method of claim 1 wherein said depositing said conformal dielectric layer over said raised germanium extrinsic base further comprises depositing said conformal dielectric layer over said emitter sacrificial post and said SiGe layer.

11. A heterojunction bipolar transistor ("HBT") comprising:
    an intrinsic base in a SiGe layer;
    a raised germanium extrinsic base over said SiGe layer;
    a base contact situated over and contacting said raised germanium extrinsic base;
    an emitter formed within an emitter opening defined by removing an emitter sacrificial post in direct contact with said SiGe layer, said emitter being situated over said intrinsic base;
    a collector situated under said intrinsic base;
    said raised germanium extrinsic base having a reduced parasitic base-collector capacitance.

12. The HBT of claim 11 further comprising a conformal dielectric layer situated over said raised germanium extrinsic base and under a portion of said emitter.

13. The HBT of claim 11 wherein said raised germanium extrinsic base is situated within an opening in a conformal dielectric layer.

14. The HBT of claim 11 wherein said raised germanium extrinsic base is encapsulated within a conformal dielectric layer, said conformal dielectric layer being defined on one side thereof by removing said emitter sacrificial post.

15. The HBT of claim 11 wherein a link base provides electrical connection between said intrinsic base and said raised germanium extrinsic base.

16. The HBT of claim 13 wherein said conformal dielectric layer comprises a nitride based dielectric.

17. The HBT of claim 11 wherein said intrinsic base comprises a single-crystal SiGe.

18. The HBT of claim 11 wherein said emitter comprises N type polysilicon.

19. The HBT of claim 11 wherein said collector is situated between two shallow trench isolation regions.

20. The HBT of claim 11 wherein a base contact is situated over and electrically coupled to said raised germanium extrinsic base.

* * * * *